US005380954A

United States Patent [19]

Orr, Jr.

[11] Patent Number: 5,380,954

[45] Date of Patent: Jan. 10, 1995

[54] WOVEN ELECTRICAL TRANSMISSION CABLE WITH CUT LINE

[75] Inventor: Lawrence W. Orr, Jr., Simpsonville, S.C.

[73] Assignee: Woven Electronics Corp., Simpsonville, S.C.

[21] Appl. No.: 131,740

[22] Filed: Oct. 4, 1993

[51] Int. Cl.$^{6}$ .......... H10B 7/08

[52] U.S. Cl. .......... 174/117 M; 156/47; 139/425 R

[58] Field of Search .......... 174/117 M, 117 F, 117 FF; 139/425 R; 156/47

[56] References Cited

U.S. PATENT DOCUMENTS

| | | | |
|---|---|---|---|
| 3,495,025 | 2/1970 | Ross | 174/117 M |
| 3,582,537 | 6/1971 | Perreault | 174/117 M |
| 3,627,903 | 12/1971 | Plummer | 174/72 A |
| 3,646,247 | 2/1972 | Sennett et al. | 174/117 M |
| 3,909,508 | 9/1975 | Ross . | |
| 4,159,394 | 6/1979 | Ross | 174/117 M |
| 4,559,411 | 12/1985 | Piper | 174/117 M |
| 4,647,323 | 3/1987 | Darstein et al. | 156/50 |
| 4,746,769 | 5/1988 | Piper | 174/117 M |
| 4,808,771 | 2/1989 | Orr, Jr. | 174/72 R |
| 4,956,524 | 9/1990 | Karkow | 174/117 M |
| 5,089,669 | 2/1992 | Piper et al. | 174/117 M |

*Primary Examiner*—Morris H. Nimmo

*Attorney, Agent, or Firm*—Henry S. Jaudon; Cort Flint

[57] ABSTRACT

The invention is directed to a woven electrical transmission cable formed with cut zones, body zones and an identification tracer. The cable is formed of an array of longitudinally extending insulated conductor warp wires arranged side by side. A plurality of longitudinally extending synthetic yarns arranged to be substantially parallel with and substantially adjacent one edge of the array of conductive wires. The synthetic yarns are colored a color which distinguishes from the color of the conductor wires. A weft yarn is woven with the array of conductor wires and the synthetic yarns to form the body zone. The weft yarn weaves only with the synthetic yarns to form the cut zones which are arranged in spaced manner longitudinally of the cable. The conductor wires weave with the weft yarn in a two up two down twill weave to form the body zones.

23 Claims, 2 Drawing Sheets

WOVEN ELECTRICAL TRANSMISSION CABLE WITH CUT LINE

BACKGROUND OF THE INVENTION

The invention relates to woven electrically transmission cable provided with lateral cut-lines formed along their length to provide individual cables of specific length. The invention particularly relates to stable flat woven electrical transmission cable in which a position identifying tracer is provided.

Flat woven electrical transmission cables are well known as is illustrated by the U.S. Pat. Nos. 3,909,508 and 4,159,394 to Ross. In the U.S. Pat. No. 3,909,508 the electrical cable is woven with insulated conductive wires arranged in a parallel array and interlaced with transversely extending picks of weft yarn. In use, the cable of this patent is cut to length and then has the weft pulled back longitudinally of the conductive wires to expose ends thereof which are then connected with connectors. There have been identified two major obstacles with the above described cable. The first obstacle occurs when the cable is cut. The cable has a tendency to become very unstable in the areas of the cut because the cut end of the weft yarn unravels and separates from engagement with the conductor wires. Another disadvantage of the Ross structure is that when the cut length of conductive cable is laid around corners or over long distances, there is a danger that the exposed wire ends and the connector terminals will become reversed.

In the Ross arrangement, the cable is woven continuous without cut lines being formed at spaced intervals. Should cut lines be formed in this cable the weave would become unstable where the weft yarn passes unsecured over the length of the cut line.

The U.S. Pat. No. 4,159,394 to Ross discloses a flat woven electrical conductor which is woven with a longitudinal cut line and which addresses the problems of the weft unraveling when the cable is cut longitudinally. The patent does not address transverse cutting.

The instant invention has for its object to overcome the problems discussed above.

Another object of the invention is to provide a flat woven flexible electrical conductor cable having longitudinally spaced cut lines and in which the body structure of the cable remains stable.

Another object of the invention is to eliminate the tendency of the cut weft end in a cut woven electrical cable to unravel.

Another object of the invention is to provide a stable twill woven electrical cable structure woven without stabilizing warp yarns.

Another object of the invention is to provide a woven electrical cable with edge identifying means.

Another object of the invention is to provide a cut woven electrical cable having plural connector positions at each end and having connector position identifying structure.

Another object of the invention is to provide a continuous twill woven electrical cable woven with spaced cut lines along its length, the cut lines having uncovered conductor wires.

Another object of the invention is to provide a twill woven electrical cable having spaced cut lines along its length and having weft transport yarns which transport the weft yarn across the cut zone.

SUMMARY OF THE INVENTION

The invention includes a method of forming a stable, cut woven electrical transmission cable which is formed by arranging a plurality of insulated warp forming conductive wires in a longitudinally extending parallel array, arranging at least two non-conductive warp forming yarns in a longitudinally extending parallel array substantially parallel with and adjacent an edge of the array of conductive wires, weaving weft yarn with the conductive warp wires and the non-conductive warp yarns to form body zones, causing the weft to breakout and weave only with the non-conductive yarns to form cut zones which provides for a positively controlled weft yarn along the length of the cable.

The method includes cutting the cable at the cut zones to form cut lengths of electrical cable in which the ends of the conductive wires freely extend from the body zone while the ends of the weft yarn are retained in position as a result of being woven with the non-conductive yarns.

The method includes causing the non-conductive warp forming yarn to form a position identifying tracer along the one edge of the conductive wires by providing that the non-conductive yarns are of a color different from that of the conductive yarns. The method also includes utilizing the position tracer to identify first positions at opposite ends of the cut conductive cable to facilitate quick and accurate connection of the cable ends with connectors.

The method also includes causing the weft yarn to heat bond with the non-conductive yarns at the point of cutting through the use of a hot knife. To insure that the bonding takes place, a thermal coating may be applied to the non-conductive yarns prior to cutting.

The invention is also directed to a continuous length of woven electrically conductive cable formed with cut zones, a body zone and having an identification tracer. The length of cable is formed of an array of longitudinally extending insulated conductor warp wires which are arranged side by side. A plurality of longitudinally extending synthetic warp yarns are arranged to be substantially parallel with and substantially adjacent one edge of the array of conductive wires. The synthetic yarns are colored a color which distinguishes from the color of the conductor wires. A weft yarn is woven with the array of conductor wires and the synthetic yarns to form the body zone. The weft yarn is cause to break from the conductor wires and to weave only with the synthetic yarns to form the cut zones which are arranged longitudinally of the cable and are on opposite sides of each body zone.

The conductive cable is constructed to have the position tracer formed by the synthetic yarns interwoven with the weft yarn along one edge thereof. The body zones as formed remain stable as the cut free ends of the weft yarn are held in position through being woven with the synthetic yarns across the cut zones. The cut conductor wires extend freely from the body zones in condition to be easily accessed.

The synthetic warp yarns and the weft yarn are preferably formed of polyamide or polyester although other synthetic materials or blends are suitable. It is also preferred that they be multi-filament synthetic yarns which are either single or multi-ply although it is possible that monofilament yarns might be used.

The synthetic warp yarn and the weft forming yarn are bonded together adjacent the cut. The weft forming yarn and the synthetic warp yarns may be coated with a thermal bonding agent at least at the cut to further facilitate bonding thereof.

The conductor wires of the body section are preferably woven in a two up, two down twill weave through each body zone. The synthetic warp yarns are woven in a one up, one down weave along their entire length. There are at least four of said conductive wires and at least two synthetic yarns.

DESCRIPTION OF THE DRAWINGS

The construction designed to carry out the invention will hereinafter be described, together with other features thereof.

The invention will be more readily understood from a reading of the following specification and by reference to the accompanying drawings forming a part thereof, wherein an example of the invention is shown and wherein.

DESCRIPTION OF THE PREFERRED EMBODIMENT

Figure 1:
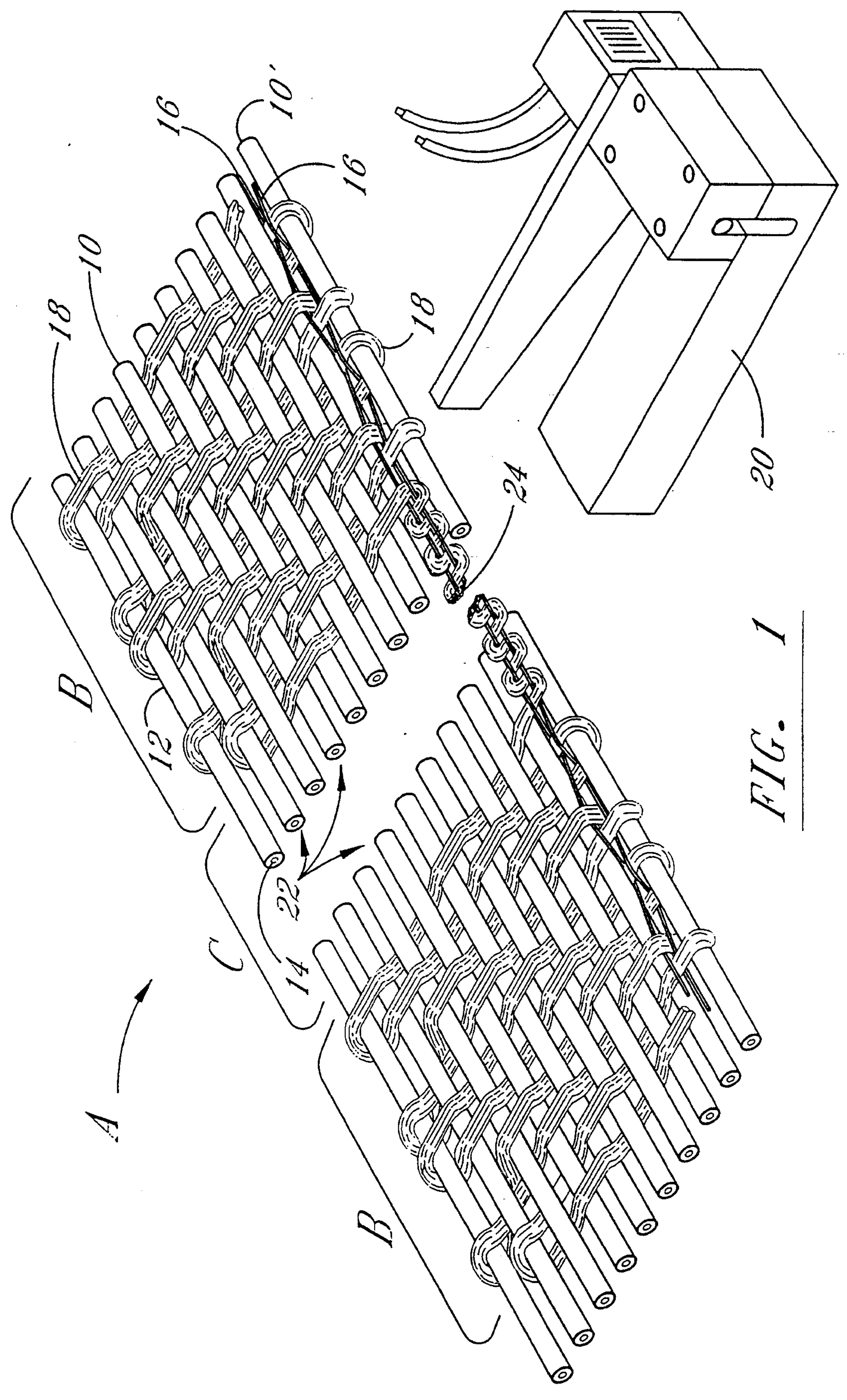
FIG. 1 is a perspective view of a length of woven electrical cable which has been cut at a cut zone.
Figure 2:
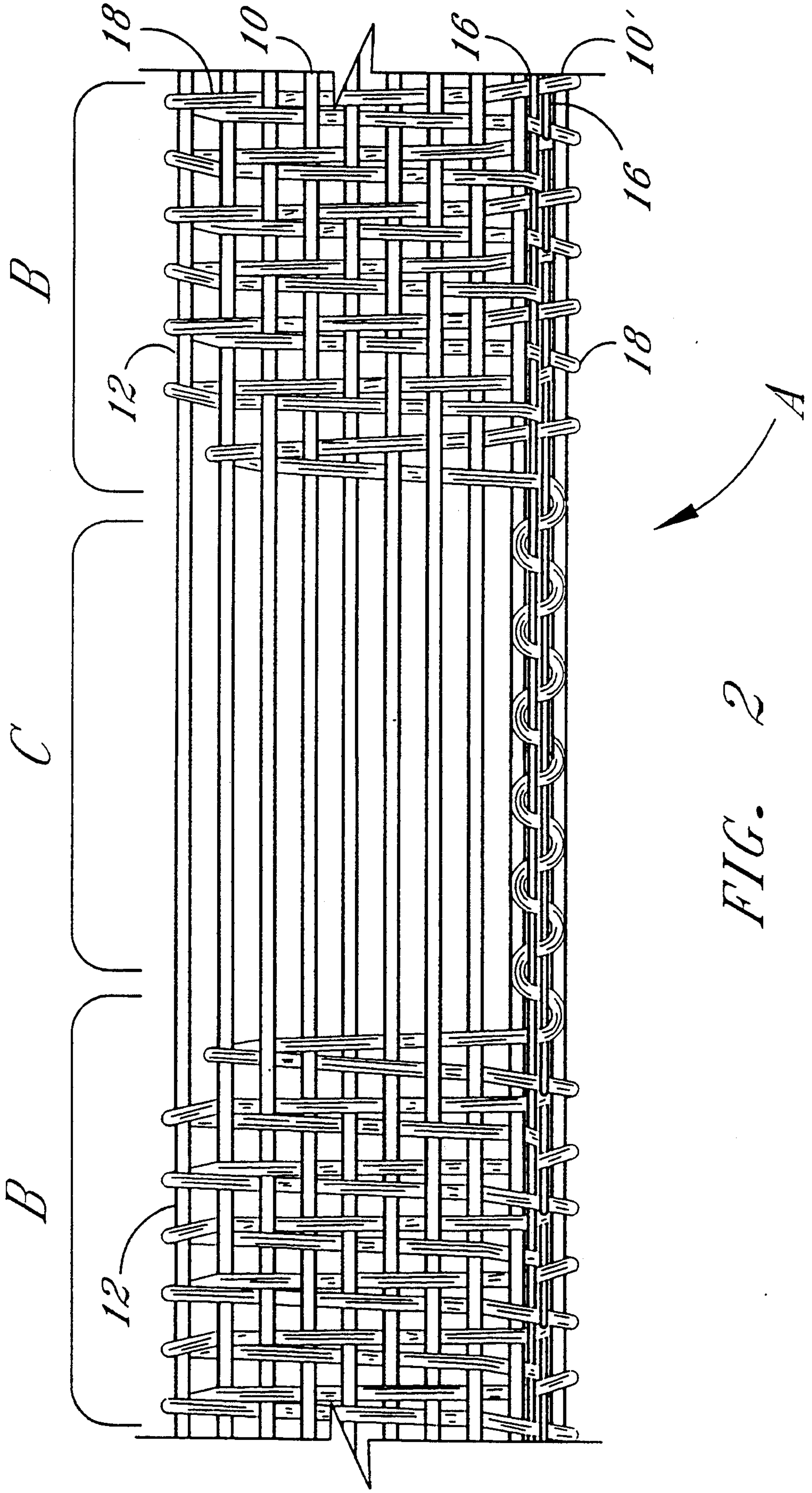
FIG. 2 is a top view showing a length of the woven electrical cable of FIG. 1.

Referring now to the drawings, FIG. 1 shows a length of flat woven electrical cable A which is formed with a body portion B and a cut zone C. The cable A is constructed of a plurality of conductive wires 10 which form warps. The conductive wires are arranged in a side by side array to be substantially parallel with each other. An additional set of warps are formed of synthetic yarns 16 which are arranged in side by side relationship and substantially parallel with conductive wires 10. The yarns 16 comprise tracer warps and are located adjacent one edge of the array of conductor wires 10 to weave between the outer most conductor wire 10' and the next conductor wire 10 as shown in FIG. 1.

A synthetic yarn 18 which constitutes the weft is arranged transversely of the conductive wires 10 and tracer yarns 16. Synthetic yarn 18 weaves with conductive wires 10 and tracer yarns 16 on successive passes across the warp array to form body portions B. These body portions are formed of variable lengths depending upon the needs required by the end use of electrical cable. Normally the body portions are formed to be between six and eight inches.

Cut zones C are formed at opposite ends of each body zone B. The cut zones are formed by causing weft yarn 18 to break out of its weave with conductive wires 10 and weave only with tracer yarns 16 across the cut zone. Weft yarn 18 weaves with tracer yarns 16 along the entire length of woven electrical cable A. Cut zones C are formed to be approximately one inch in length although this may vary according to need.

It is preferred that the weave pattern for body zone B be a two up two down twill for the conductor wires 10 and weft yarn 18 such as is disclosed in U.S. Pat. No. 3,909,508. This weave is a four pick, four warp repeating pattern and provides good stability and flexibility for the body zone. The weave pattern for the tracer warp 16 with weft yarn 18 is a one up one down plane weave. This weave pattern is also well known.

It has been found that a two up two down twill forms a stable cable structure which does not necessitate the use of spacer warps arranged between the conductor warps. Also the weft yarns do not cut into the insulation of the conductor wires which it sometimes does when weaving one up one down.

The number of warp yarns 10 and 16 forming the cable may vary depending upon the need requirements for the cable.

Conductive warps 10 preferable consist of a conductive wire core 14 encapsulated within a non conductive synthetic insulation 12. It is preferred that the insulation 12 be colored a single color such as black or purple.

The wire size for conductor warp 10 is normally limited to 160 nominal O.D. or smaller; however, the size selected is determined by the end use of the cable and forms no part of the invention.

The tracer warp 16 is preferably formed of a non conductive synthetic material such as a polyester, polyamide or a polyester polyamide blend, and may be either in monofilament or multi-filament form. Obviously other synthetics could be used along with natural fiber yarns if desired. It is preferred that tracer warp 16 be colored a single color which is easily visible against the background formed by insulation 12 of conductor warp wires 10. It is preferred that the tracer warp be multifilament yarn which is between 400 and 3000 denier; however, this may vary depending on the demands of the end use.

Weft yarn 18 is also formed of synthetic materials such as polyamide, polyester, or blends thereof. It is preferred that weft yarn 18 be between 200 and 3000 denier and be a multi-filament yarn. Again staple or monofilament yarns could be used.

In practice, a desired length of electrically conductive cable A is formed or drawn out. Hot cutters 20 are positioned intermediate spaced cut zones C. The cutters are actuated to separate electrical cable A at cut zones C and to form a plurality of freely extending cut ends 22 of conductive wires 10 at these zones. Severed sections 24 of weft 18 woven with tracer warps 16 are also formed. Conductive ends 22 are readily accessible to be engaged with connector members.

Hot knife 20 when cutting sections 24 cause the synthetic weft 18 and synthetic tracer warp 16 to fuse together at least at the point of cutting. In some instances it is desirable to coat sections 24 with a heat activated adhesive prior to cutting to further insure a strong bond between the cut weft ends and the cut tracer ends.

Sections 24 act to hold weft yarn 18 in its woven position which removes any tendency for the weft yarn to unravel which would allow warp wires 10 in body zone B to become unstably held in position. Thus the cut section of woven electrical cable A retains it stability.

Tracer warps 16 which are arranged adjacent an edge of the array of conductor wires 10 serve an additional function. Because tracer yarns 16 contrast with conductor wires 10 they are easily visible. Because they are located adjacent a single conductor wire 10' along the entire length of conductor cable A they serve as a position indicator. This insures that the proper opposed cut ends 22 of conductor wires 10 are aligned and connected with the proper terminals of spaced connectors.

The weft yarn 18 is disclosed as weaving in single picks and being inserted through the warp alternately from opposite sides thereof. It is within the scope of this invention to weave weft yarn 18 as double picks which are inserted from only a single side of the warp.

While a preferred embodiment of the invention has been described using specific terms, such description is for illustrative purposes only, and it is to be understood that changes and variations may be made without departing from the spirit or scope of the following claims.

What is claimed is:

1. A method of forming a stable, cut woven electrical cable comprising the steps of:
- arranging a plurality of insulated warp forming conductive wires in a longitudinally extending parallel array;
- arranging at least two non-conductive warp forming yarns in a longitudinally extending array substantially parallel with and adjacent an edge of said array of conductive warp wires;
- forming stable body zones along a length of said cable by weaving a weft yarn with said conductive warp wires and said non-conductive warp yarns;
- forming cut zones along said length of said cable by causing said weft yarn to break out and weave only with said non-conductive warp yarns so that said cable may be cut at selected cut zones to produce individual electrical cables having controlled cut weft yarn ends.

2. The method of claim 1 including cutting said cable at selected of said cut zones so that ends of said conductive warp wires freely extend from said body zones and cut ends of said weft yarn remain woven with said non conductive warp yarns to be held stable against unraveling.

3. The method of claim 1 including forming said insulation for said conductive warp wires of a color which differs from that of the non-conductive warp yarns so that said non-conductive warp yarns form an identifying tracer.

4. The method according to claim 1 including cutting said cable with a hot knife to cause said weft yarn to bond with said non-conductive warp yarns at least adjacent the point of cutting.

5. The method of claim 4 including coating at least said non-conductive yarns prior to cutting to insure bonding between said non-conductive warp yarns and said weft yarn.

6. The method of claim 1 including employing different weave patterns to weave said weft yarn with said conductive wires and said non-conductive warp yarns.

7. The method of claim 6 including weaving said weft yarn with said conductive warp wires in a twill pattern.

8. The method of claim 7 including weaving said weft yarn with said conductor warp wires in a two up two down twill pattern.

9. The method of claim 1 including weaving said weft yarn as single picks.

10. A woven electrically conductive cable having cut sections comprising:
- a plurality of substantially parallel insulated conductor wires forming first warp members;
- a plurality of substantially non-conductive yarns arranged substantially parallel with said first warp members and forming second warp members;
- a non-conductive weft forming yarn interlacing with said first and second warp members along first lengths thereof, said non-conductive weft yarn and said first and second warp members forming body sections of said conductive cable;
- said non-conductive weft yarn interlacing with only said second warp members along second lengths of said conductive cable to form cut sections in which said conductive first warp members extend unwoven with said non-conductive weft yarn; whereby,
- said second warp members act to stabilize said woven cable by controlling said non-conductive weft yarn along said cut sections.

11. The cable of claim 10 wherein said conductor wires are arranged in an array and said non-conductive yarns are arranged substantially along one edge of said array, said non-conductive yarns forming an edge tracer which assist in edge identification.

12. The cable of claim 11 wherein said conductor wires and said non-conductive yarns are of different colors which assist in distinguishing one from the other.

13. The cable of claim 10 wherein said non-conductive yarns are one of polyamide, polyester, and polyamide and polyester blend.

14. The cable of claim 13 wherein said non-conductive yarns are multi-filament synthetic yarns.

15. The cable of claim 10 wherein said non-conductive weft yarn is one of either polyamide, polyester, and polyamide and polyester blend.

16. The cable of claim 10 wherein when said cable is cut along said cut line and said non-conductive yarn and said non-conductive weft yarn are bonded together at least adjacent said cut.

17. The cable of claim 16 wherein said non-conductive weft yarn and said non-conductive yarns are coated with a bonding agent at least at said cut.

18. The cable of claim 10 wherein said conductor wires and said weft yarns forming said body sections are woven in a two up, two down twill weave.

19. The cable of claim 10 wherein said non-conductive yarns are woven in a one up, one down weave along the length of said cable.

20. The cable of claim 10 wherein said conductor wires and said weft yarns are woven in a twill weave pattern to form said body sections.

21. A woven electrical conductive cable having a tracer line, cut zones of a first length, and body zones of a second length:
- said cable being formed of a plurality of side by side longitudinally extending insulated conductor warp wires, said insulation being colored a first color;
- a plurality of longitudinally extending synthetic warp yarns arranged substantially parallel with and substantially adjacent one edge of said conductor wires forming said tracer line, said synthetic warp yarns being colored a second color different than said first color;
- a weft yarn weaving generally in a twill weave pattern with said conductor wires over said second lengths to form said body zones;
- said weft yarn weaving with said synthetic warp yarns over said first and second lengths to form said tracer line; whereby,
- said tracer line acts to identify a first position of said electrically conductive cable, and to stabilize said body zone by controlling said weft yarn across said cut zones of said conductive cable.

22. The cable of claim 21 wherein there are at least two of said synthetic yarns and at least four of said conductor wires.

23. The cable of claim 21 wherein said twill weave pattern comprises a two-up, two-down regular twill weave pattern.

* * * * *